United States Patent [19]
Tang et al.

[11] Patent Number: 5,900,630
[45] Date of Patent: May 4, 1999

[54] RADIATION DETECTION APPARATUS

[75] Inventors: Tony T. Tang, Glendale, Calif.; Brian T. Cunningham, Watertown, Mass.; Donald L. Lee, Lexington, Mass.; Richard F. Adams, Chelmsford, Mass.; Sergey Liberman, Bedford, Mass.

[73] Assignee: Raytheon Company, Lexington, Mass.

[21] Appl. No.: 08/650,564

[22] Filed: May 20, 1996

Related U.S. Application Data

[63] Continuation of application No. 08/266,047, Jun. 27, 1994, abandoned.

[51] Int. Cl.$^6$ .......................... H01L 25/065; H01L 27/146
[52] U.S. Cl. ................. 250/338.4; 250/332; 250/339.02; 250/370.08
[58] Field of Search .................. 250/339.02, 370.08, 250/338.4, 332

[56] References Cited

U.S. PATENT DOCUMENTS

| | | | |
|---|---|---|---|
| 4,939,369 | 7/1990 | Elabd | 250/332 |
| 5,036,203 | 7/1991 | Solomon | 250/370.06 |
| 5,239,179 | 8/1993 | Baker | 250/338.4 |
| 5,367,166 | 11/1994 | Matthews et al. | 250/338.1 |
| 5,422,475 | 6/1995 | Norton | 250/216 |
| 5,512,750 | 4/1996 | Yanka et al. | 250/338.4 |

OTHER PUBLICATIONS

Hutley, M. et al., Digital Optical Processing, Displays and Optical–Fibre Coupling Are Amongst Many Areas to Benefit From Improved Fabrication of Tiny Optical Components: Microlens Arrays, Physics World, Jul. 1991, pp. 27–32.

Bollinger, D. et al., A New Production Technique: Ion Milling, Solid State Technology, Nov. 1980, pp. 79–84.

Gordon, N. et al., "Application of Microlenses to Infrared Detector Arrays", Infrared Phys. vol. 31, No. 6, pp. 599–604, 1991.

*Primary Examiner*—Constantine Hannaher
*Attorney, Agent, or Firm*—Glenn H. Lenzen, Jr.; Andrew J Rudd

[57] ABSTRACT

An infrared energy detection apparatus having a first array of infrared detectors adapted to detect infrared energy of a first wavelength and produce an electrical signal corresponding to such detected energy, and a second array of infrared detectors, positioned to intercept infrared energy passing through the first array, and adapted to detect energy of a second wavelength in such intercepted energy and produce an electrical signal corresponding to such detected energy. The first array of infrared detectors includes an array of detector devices formed along a lower portion thereof adapted to detect a portion of radiation impinging on the upper portion thereof and, electronic circuitry disposed between the upper and lower portions and connected to the detector devices for producing electrical signals representative of the detected energy having the first wavelength. The second array of infrared detectors includes an array of detector devices adapted to detect a portion of radiation passed through the first array of detectors and impinging on the second array and having the second wavelength and, electronic circuitry for producing electrical signals representative of the detected energy having the second wavelength. The first array of infrared detectors has formed therein an array of lenses to direct infrared energy impinging on the upper surface to the detector devices formed in the first array.

7 Claims, 6 Drawing Sheets

RADIATION DETECTION APPARATUS

This application is a continuation of application Ser. No. 08/266,047 filed Jun. 27, 1994, now abandoned

BACKGROUND OF THE INVENTION

This invention relates generally to radiation detection apparatus and more particularly to radiation detection apparatus adapted to detect radiation at two different wavelengths.

As is known in the art, radiation detectors are used in a wide range of applications. In one application, an array of the infrared detectors is used to detect the infrared energy emitted by objects in a scene under observation. Each infrared detector generates an electrical charge in response to the portion of the emitted energy it detects. Electrical read out circuitry is provided for converting the generated charge into a corresponding electrical signal. The electrical signals are combined by a processor which produces a corresponding visual image of the observed scene. Thus, each detector provides the data for a corresponding pixel of the produced visual image.

In one arrangement, the infrared detectors are formed as an array of electrically isolated photo-diode detectors along one surface of a semiconductor chip, typically a chip of InSb or HgCdTe. Each photo-diode in the array generates an electrical current representative of the amount of infrared power focused to it. The current is integrated by an integration circuit, typically a capacitor to produce an electrical signal representative of the infrared energy impinging the photo-diode detector. The integrated signal is read out and passed to the processor. In one arrangement, the read out circuit is formed as an integrated circuit in a second semiconductor chip, typically Si. More particularly, an array of read out circuits is arranged in a matrix of rows and columns formed in the second semiconductor chip. Each one of the read out circuits is disposed in vertical alignment, or registration with, and is electrically connected to, a corresponding one of the photo-diode detectors. Thus, the first and second semiconductor chips are disposed in overlaying parallel planes. This arrangement allows for the direct electrical connection between each photo-diode detector and its associated read out circuit.

While such arrangement provides suitable detection at one wavelength of the emitted infrared energy, in some applications it is desirable to simultaneously detect energy in two different wavelengths for each pixel.

SUMMARY OF THE INVENTION

With this background of the invention in mind it is an object of this invention to provide an improved radiation detector.

It is another object of the invention to provide a radiation detector system adapted to detect energy in two different wavelengths simultaneously for each pixel.

These and other objects of the invention are attained generally by providing an infrared energy detection apparatus having a first array of infrared detectors adapted to detect infrared energy of a first wavelength. Each one of the infrared detectors in the array is adapted to produce an electrical signal corresponding to such detected energy in a corresponding one of an array of pixels. A second array of infrared detectors is provided. The second array of detectors is adapted to detect infrared energy of a second, longer wavelength. Each one of the infrared detectors in the second array is positioned behind a corresponding one of the detectors in the first array. The electrical signal produced by each one of the detectors in the first array of detectors is produced simultaneously with, and independently of, the electrical signal produced by the corresponding one of the detectors in the second array of detectors.

With such arrangement, apparatus is provided to simultaneously detect radiation at two different wavelengths emitted from the same point of an object under observation. Thus, for each pixel in a scene under observation, radiations at two different wavelengths associated with such pixel are detected with spatial and time coincidence.

BRIEF DESCRIPTION OF THE DRAWINGS

The aforementioned features and other objects of the invention, as well as the invention itself, will be more fully understood from the following description read together with the accompanying drawings, in which:

FIGS. 5A–5G are diagrammatical sketches useful in understanding the formation of an array of lenses formed in a surface of still another semiconductor body used in the apparatus of FIGS. 1 and 2; FIGS. 5A–5D being schematic, cross section elevation views of the body at various stages in the manufacture of the lenses.

DESCRIPTION OF THE PREFERRED EMBODIMENTS

Figure 1:
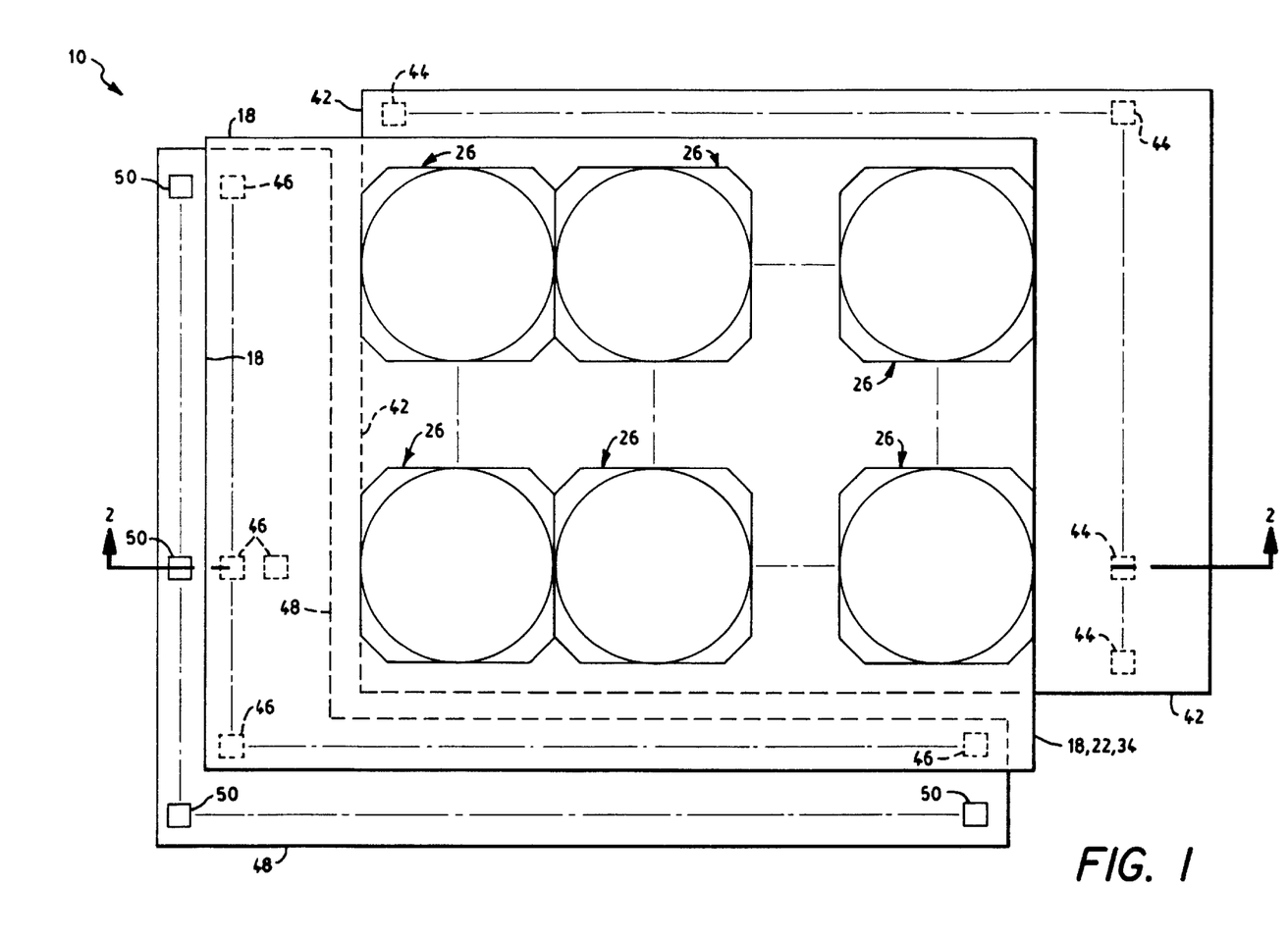
FIG. 1 is a top elevation schematic view, somewhat simplified of a radiation detection apparatus according to the invention.
Figure 2:
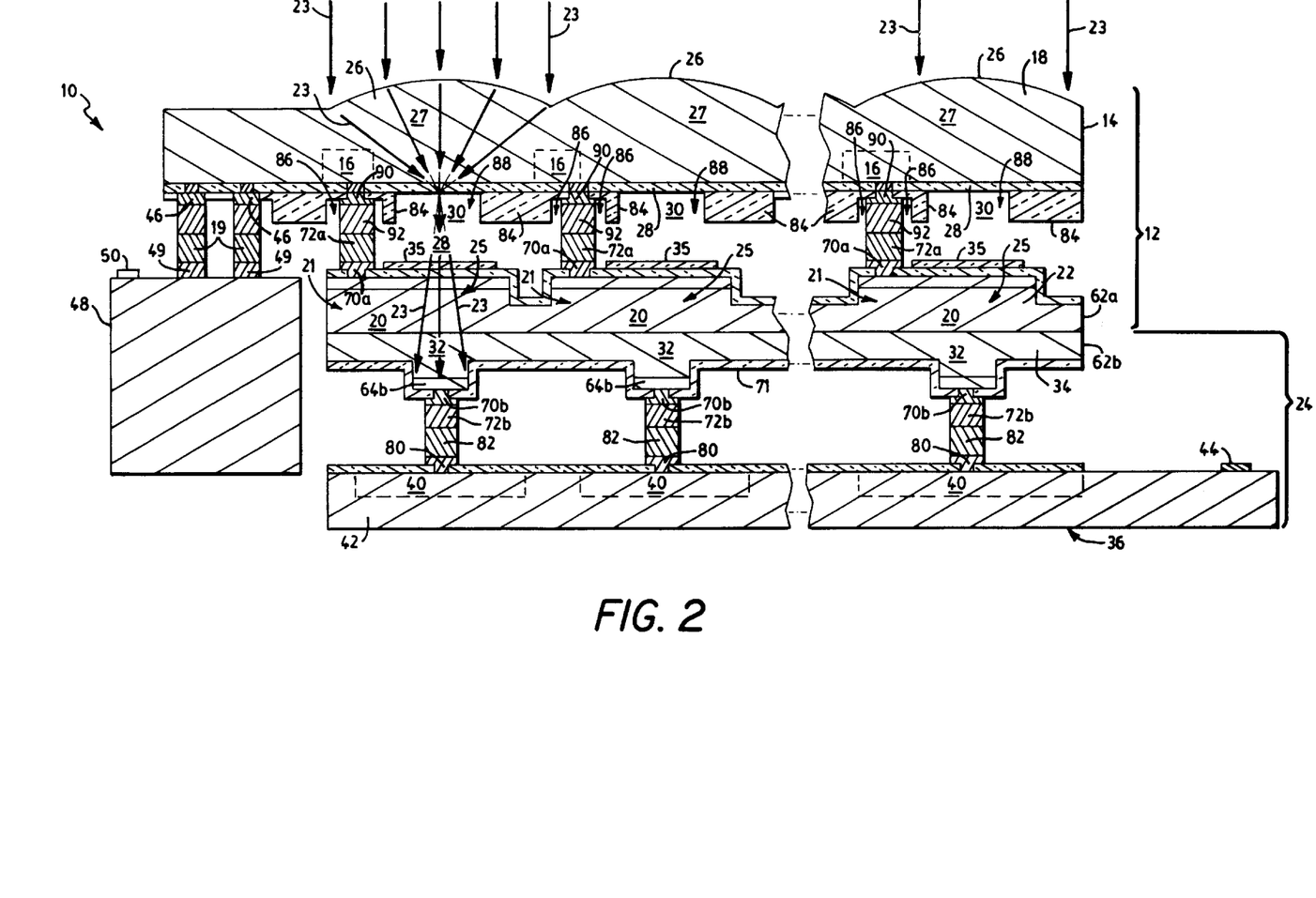
FIG. 2 is a side elevation, schematic view, somewhat simplified, of the radiation detection apparatus of FIG. 1, such view being taken along line 2—2 of FIG. 1.

Referring now to FIGS. 1 and 2, radiation detection apparatus 10 is shown adapted to simultaneously detect radiation at two different wavelengths emitted from the same point of an object, not shown, under observation. Thus, for each point of the object, radiations emitted from such point at two different wavelengths are detected with spatial and time coincidence. The apparatus 10 includes a first array of radiation detectors 12. The first array of radiation detectors 12 includes first electronic circuitry 14 made up of an array of electrically isolated read out circuits 16 formed in the lower portion of a first semiconductor body 18, or chip, here Si, as a conventional integrated circuit and also arranged in a corresponding array of rows and columns; and a first array of electrically isolated detector devices 20, here photo-diode detector devices arranged in a matrix of rows and columns and formed in a second semiconductor body 22, or chip, here HgCdTe. Each one of the read out circuits 16 is disposed in vertical alignment, or registration with, and is electrically connected to, a contact portion 21 of a corresponding one of the photo-diode detector devices 20. Thus, the first and second semiconductor chips 18, 22 are disposed in overlaying parallel planes. This arrangement allows for the direct electrical connection between each photo-diode detector devices 20 and its associated read out circuit 16. The first array of radiation detector devices 20 is adapted to detect a portion of the emitted radiation having the first wavelength, here 4.0–5.0 micrometers, impinging thereon from the object. Each one of the detector devices 20 corresponds to a pixel. Thus, the first electronic circuitry 14 produces electrical signals representative of the detected portion of the radiation having the first wavelength, each one of the read out circuits 16 producing an electrical signal representative of the detected portion of the radiation having the first wavelength in the corresponding one of the pixels.

The first array of radiation detectors 12 is also adapted to pass therethrough a portion of the impinging radiation 23 to a second array of radiation detectors 24. More particularly, the first semiconductor body 18 has formed in the upper surface thereof an array of lenses 26. Each lens 26 corresponds to a pixel. The radiation 23 impinging on the upper portion of the first semiconductor body 18 is focused, through regions 27 in the first semiconductor body 18, into a focal point 28 at the center of the pixel onto an optical aperture 30, formed, in a manner to be described, in the lower surface portion of the first semiconductor body 18. It is noted that the regions 27 are between the read out circuits 16 so that the focussed radiation passing through regions 27 does not pass through the region of the first semiconductor body 18 where the read out circuits 16 are formed.

The focussed radiation 23 then emerges from the first semiconductor body 18 to impinge upon the first array of detector devices 20 formed in the upper portion of the second semiconductor body 22. More particularly, the focussed radiation 23 then emerges from the first semiconductor body 18 to impinge upon a radiation impinging portion 25 of the detector devices 20. Thus, each diode detector device 20 includes a contact portion 21 and a laterally disposed radiation intercepting portion 25. As result, radiation intercepted by radiation portion 25 generates charge in the photo detector device 20, such charge being read out of the device 20 through the electrically coupled, laterally displaced contact portion 21 and the corresponding one of the read out circuits 16 electrically connected thereto.

The apparatus 10 includes the second array of radiation detectors 24. The second array of radiation detectors 24 includes a second array of electrically isolated detector devices 32, here photo-diode detector devices, arranged in a matrix of rows and columns and formed in a third semiconductor body 34, or chip, here HgCdTe; and, second electronic circuitry 36 made up of an array of electrically isolated read out circuits 40 formed in the upper portion of a fourth semiconductor body 42, or chip, here Si, as a conventional integrated circuit and also arranged in a corresponding array of rows and columns. Each one of the read out circuits 40 is disposed in vertical alignment, or registration with, and is electrically connected to, a corresponding one of the photo-diode detector devices 32. Thus, the third and fourth semiconductor chips 34, 42 are disposed in overlaying parallel planes. This arrangement allows for the direct electrical connection between each photo-diode detector device 32 and its associated read out circuit 40. The second array of detectors devices 32 is adapted to detect a portion of the emitted radiation having the second, longer wavelength, here 9.0–10.0 micrometers, impinging thereon from the object. Each one of the detector devices 32 corresponds to a pixel. Thus, the second electronic circuitry 36 produces electrical signals representative of the detected portion of the radiation having the second wavelength, each one of the read out circuits 40 producing an electrical signal representative of the detected portion of the radiation having the second wavelength in the corresponding one of the pixels.

The lower surface of the second semiconductor body 22 is attached to the upper surface of the third semiconductor body 34. The radiation, after impinging the lenses 26 formed in the upper surface of the first semiconductor body 18 and emerging from the lower surface thereof through optical aperture 30, passes, via anti-reflection coating 35, into the second semiconductor body 22 (i.e., more through the radiation intercepting portions 25 of the diode detector devices 20) for detection by the first array of detector devices 20. The radiation then passes through the upper portion of the third semiconductor body 34 to the lower portion of such body 34 for detection by the second array of detector devices 32, as noted above.

Each one of the detector devices 32 in the second array thereof is disposed in vertical alignment, or registration with, a corresponding one of the detector devices 20 in the first array thereof. More particularly, each one of the detector devices 32 in the second array thereof is disposed in vertical alignment, or registration with, the radiation intercepting portion 25 of a corresponding one of the detector devices 20 in the first array thereof. Thus, each one of the detector devices 20 in the first array has a corresponding, vertically aligned detector device 32 in the second array so that both detector devices 20, 32 sense radiation for the same pixel; albeit that the detector device 20 in the first array detects the radiation of the first wavelength and the detector device 32 in the second array detects the radiation in the second, longer wavelength. Furthermore, the read out circuit 16 connected to the detector device 20 in the first array and the read out circuit 40 connected to the detector device 32 in vertical alignment therewith both produce electrical signals representative of the radiation for the same pixel; albeit that the read out circuit 16 connected to the detector device 20 in the first array produces an electrical signal representative of the radiation having the first wavelength and the read out circuit 40 connected to the detector device 32 in the second array produces an electrical signal representative of the radiation having the second, longer wavelength. With such arrangement, the detection apparatus 10 is adapted to simultaneously detect radiation at two different wavelengths emitted from the same point of an object under observation. Thus, for each pixel in a scene under observation, radiations at two different wavelengths associated with such pixel are detected with spatial and time coincidence.

The electrical signals produced by the read out circuits 40 formed in the fourth semiconductor body 42 are electrically connected in a conventional manner, by rows and columns of electrical conductors, not shown, to read out contacts 44 formed about the right and upper peripheral portions of the chip 42, as shown. Thus, each electrical contact 44 is electrically connected, via a corresponding one of the read out circuits 40, to a corresponding one of the photo diode detector devices 32 and is adapted to produce an electrical signal representative of the infrared radiation detected by the photo diode detector connected thereto. Likewise, the electrical signals produced by the read out circuits 16 formed in the first semiconductor body 42 are electrically connected in a conventional manner, by rows and columns of electrical conductors, not shown, to read out contacts 46 formed about the left and lower peripheral portions of the first semiconductor body 18, as shown. Thus, each electrical contact 46 is electrically connected, via a corresponding one of the read out circuits 16, to a corresponding one of the photo diode detectors 20 and is adapted to produce an electrical signal representative of the infrared radiation detected by the photo diode detector connected thereto. A sideboard 48, here made of silicon has electrical contacts 19, here indium bumps, vertically aligned under, and electrically connected to the read out contacts 46, as shown. These later read out contacts 46 are electrically connected by conductors, not shown, on the sideboard 48 to the final read out contacts 50 for the apparatus 10, as shown.

Figure 3:
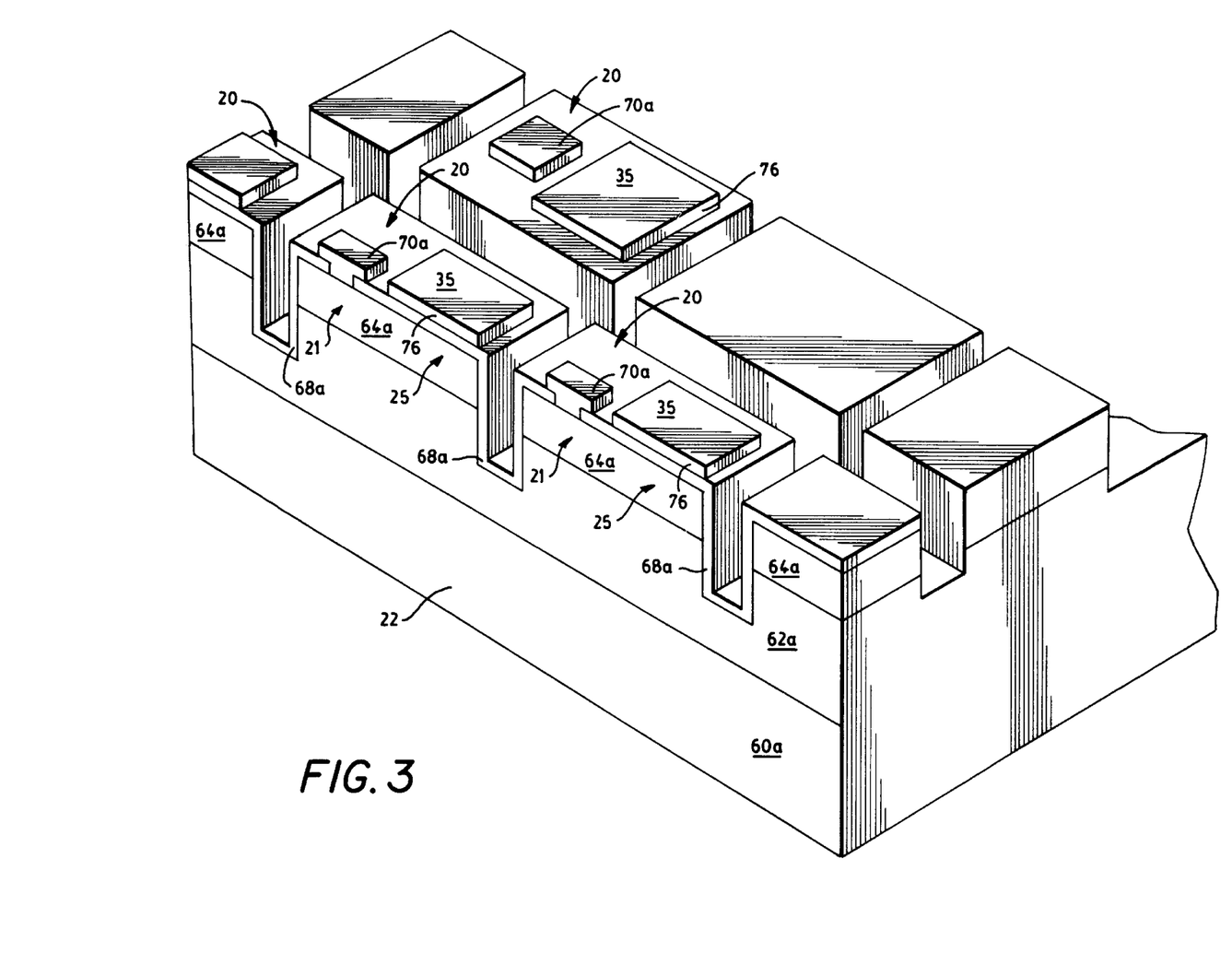
FIG. 3 is an isometric, cross sectional sketch of a semiconductor body used in the apparatus of FIGS. 1 and after an early stage in the processing of such body, such body having an array infrared detector devices formed therein, such devices being adapted to detect radiation having a first wavelength.
Figure 4:
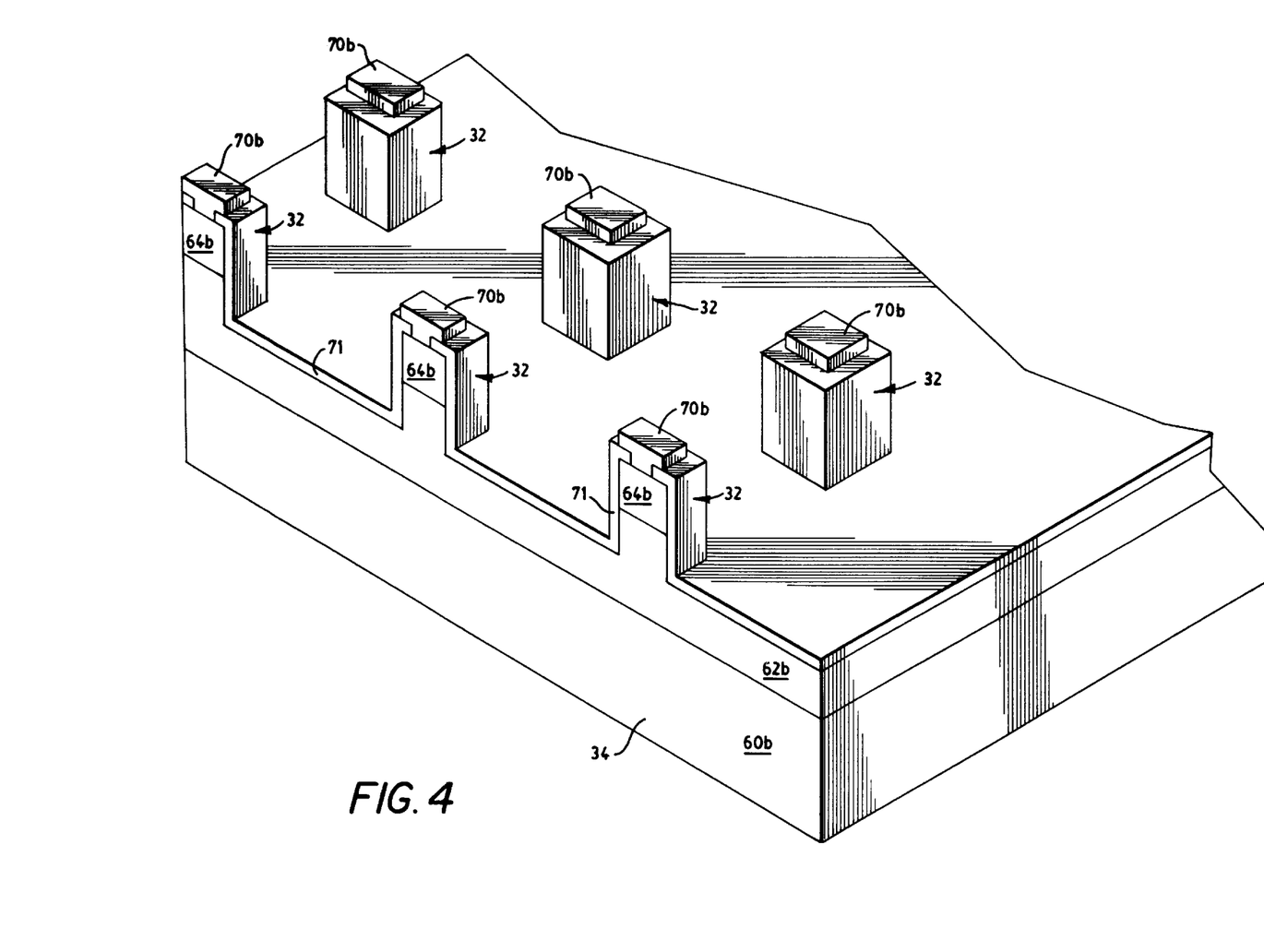
FIG. 4 is an isometric, cross sectional sketch of another semiconductor body used in the apparatus of FIGS. 1 and after an early stage in the processing of such body, such body having an array infrared detector devices formed therein, such devices being adapted to detect radiation having a second wavelength.

The second and third semiconductor bodies 22, 34 are shown at an early stage in the fabrication thereof, in detail in FIGS. 3 and 4, respectively. Thus, the second and third semiconductor bodies 22, 34, each include a II–VI substrate 60a, 60b, respectively, here CdTe, with an n-type, here a 20 micron thick, $1\times10^{15}$ atoms/centimeter$^3$ In doped $Hg_{(1-x)}Cd_xTe$ epitaxial, base layer 62a, 62b, respectively, and a p-type, here a 1 micron thick, $1\times10^{17}$/cm$^3$ Sb doped $Hg_{(1-y)}Cd_yTe$ epitaxial, cap layer 64a, 64b, respectively, formed thereon; Both bodies 22, 34, with the layers 62a, 62b, 64a, 64b formed thereon, are here purchased from Fermionics. The value x is selected in accordance with the wavelength to be detected by the diode detector devices 20, 32, respectively, formed therein. Thus, here x is 0.21 for the longer wavelength detection (i.e., for the base epitaxial layer 62b of the third semiconductor body 34) and x is here 0.25 for the shorter wavelength detection (i.e., for the base epitaxial layer 32a of the second semiconductor body 22). The value y is here 0.3 for both the cap layers 64a, 64b.

The third semiconductor body 34 (FIG. 4) has the second array of electrically isolated diode detector devices 32 formed therein. Here, such devices 32 are formed by etching an array of rows and columns of mesa structures through portions of the cap layer 64b into underlying portions of the base layer 62a using conventional photolithographic-chemical etching techniques. The etch of the mesas is, here, 2–3 microns in depth. After etching the mesas and removing the photoresist layer mask (not shown) used to selectively etch the mesas, the etched surface is coated with a 0.5 micron thick layer 68b of evaporated CdTe to form a dielectric passivation layer 71. A layer of photoresist, not shown, is the deposited over the passivation layer 68b and patterned with vias over the portions of the tops of the mesas where metal electrical contacts 70b are to be made to the HgCdTe cap layer 64b using conventional photolithographic-chemical etching techniques. A layer of gold is then evaporated over the photoresist layer, not shown, and through the vias onto the exposed portions of the tops of the mesas where the electrical contacts 70b are to be made. The electrical contacts 70b are formed as shown by "lifting-off" the photoresist and the portions of the gold evaporated thereon. The portions of the gold evaporated through the vias remain as the electrical contacts 70b, as shown. Indium bumps 72b (FIG. 2), here 10 microns high, are formed on the gold electrical contacts 70b again using conventional photolithographic "lift-off" techniques.

The second semiconductor body 22 has the first array of electrically isolated diode detector devices 20 formed therein. Here such devices 20 are formed in a similar manner to the formation of the devices 32 described above in FIG. 4 in connection with the third semiconductor body 34. Thus, the first array of electrically isolated diode detector devices 20 is formed by etching an array of rows and columns of mesa structures through portions of the cap layer 64a into underlying portions of the base layer 62a using conventional photolithographic-chemical etching techniques. The depth of each of the mesas is, here, 2–3 microns, as with the mesas described in connection with FIG. 4; here however the mesa are elongated to a length, here in the order of 45 microns. After etching the mesas and removing the photoresist layer mask, not shown, used to selectively etch the mesas, the etched surface is coated with a 0.5 micron thick layer 68a of evaporated CdTe to form a dielectric passivation layer. A layer of photoresist, not shown, is then deposited over the passivation layer 68a and patterned with vias over the portions of the tops of the mesas where metal electrical contacts 70a are to be made to the HgCdTe cap layer 64a using conventional photolithographic-chemical etching techniques. A layer of gold is then evaporated over the photoresist layer, not shown, and through the vias onto the exposed portions of the tops of the mesas where the electrical contacts 70a are to be made. The electrical contacts 70a are formed as shown by "lifting-off" the photoresist and the portions of the gold evaporated thereon. The portions of the gold evaporated through the vias remain as the electrical contacts 70a, as shown. It is noted that the electrical contacts are disposed over the contact portions 21 of the diode detectors 20. A layer of photoresist, not shown, is deposited over the surface and is patterned to have small square apertures, not shown, formed therein in regions adjacent to the electrical contacts 70a; i.e., the apertures are disposed over the radiation intercepting portions 25 of the diode detectors 20 where the anti-reflection coating 35 (FIG. 2) is to be deposited. It should be noted that the contact portion 21 and the radiation intercepting portion 25 share the same cap layer 64a and underlying base layer 62a. Thus, both portions 21, 25 are part of the same photo diode detector device 20.

A layer 76 of $Y_2O_3$ is deposited over the photoresist layer, not shown, and through the apertures, not shown, formed therein onto the exposed portions of the CdTe passivation layer 68a. The photoresist layer, with the $Y_2O_3$ layer 76 deposited thereon, is "lifted-off", leaving an array of rows and columns of small $Y_2O_3$ optical window of anti-reflection coatings 35, each one thereof being disposed over the radiation intercepting portion 25 of a corresponding one of the detector devices 20, as shown. As with the third semiconductor body 34, indium bumps 72a (FIG. 2), here 10 microns high, are formed over the gold electrical contacts 70a again using conventional photolithographic "lift-off" techniques.

Referring again to FIG. 2, the second electronic circuitry 40 is formed in the fourth, silicon semiconductor body 42 using conventional integrated circuit processing techniques. The read out circuits 40 are formed as an array of rows and columns of electrically isolated integrated circuits, each one having an electrical contact 80, here aluminum, and an indium bump 82 formed, as shown and as described above in connection with the second and third semiconductor bodies 22, 34. The indium bumps 82, here 10 microns high, formed on the electrical contacts 80 of the fourth semiconductor body 34 are in registration with the indium bumps 70b formed on the third semiconductor body 22.

The first electronic circuitry 14 is formed, using conventional integrated circuit processing techniques, in the regions of the first semiconductor body 18 between the regions 27 where the radiation is focussed, as described above. The read out circuits 16 are formed as an array of rows and columns of electrically isolated integrated circuits. The read out circuits 16 are formed as an array of rows and columns of electrically isolated integrated circuits, each one having an electrical contact 90, here gold, and an indium bump 92 formed, as shown and as described above in connection with the second and third semiconductor bodies 22, 34. The indium bumps 92, here 10 microns high, formed on the electrical contacts 90 of the first semiconductor body 18 are in registration with the indium bumps 72b formed on the second semiconductor body 22.

More particularly, after forming the read out circuits 16 and the rows and columns of electrical conductors, not shown, used to electrically interconnect such read out circuits 16 to electrical contacts 46, a layer 84 of silicon dioxide, here 0.5 micron thick, is deposited over the surface of the structure, as shown. Each one of the read out circuits 16 in the array thereof occupies a surface area of here 50 microns by 50 microns and includes in such 50 micron surface area a pair of square apertures 86, 88 formed in the deposited silicon dioxide layer 84. One of the apertures 86, 88, here aperture 86 is 5 microns square and is disposed over the aluminum electrical contact 98 to the associated read out circuit 16. The other aperture 88 is 22 microns square and is formed laterally displaced from the integrated circuitry used to form the read out circuits 16 and under the focal point 28 formed in the first semiconductor body 18. Such aperture 88 exposes the underlying silicon surface. This aperture 88 provides the optical aperture 30, discussed above. An anti-reflection coating, not shown, is deposited into the larger aperture 88 using conventional "lift-off" techniques. The anti-reflection coating is formed by first depositing a layer of ZnS over a photoresist layer, not shown, having an aperture formed therein and disposed over the aperture 88 and next depositing a layer of $Y_2O_3$ over the deposited ZnS layer. Lifting off the photoresist layer, not shown, with the deposited ZnS and $Y_2O_3$ layer leaves the 0.5 micron thick anti-reflection coating in the aperture 88 to fill such aperture 88. The opposite surface of the first semiconductor body 18 is thinned and polished to the correct thickness, here to a thickness of approximately 260 microns, so that the previously exposed underlying surface of the silicon of such first semiconductor body 18 will be disposed in the focal plane of the corresponding, vertically positioned lens 26, as discussed above.

Figure 5A:
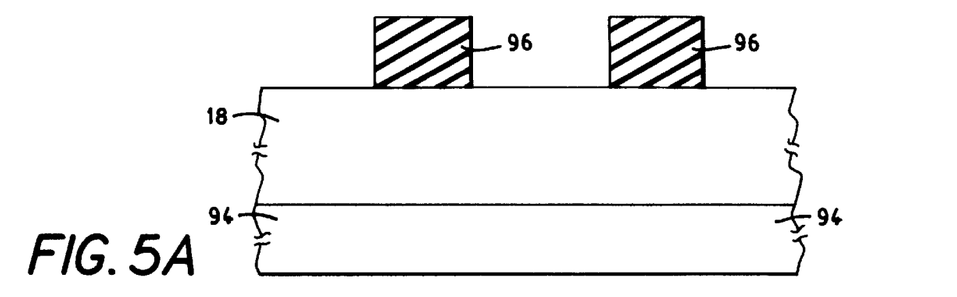
Figure 5B:
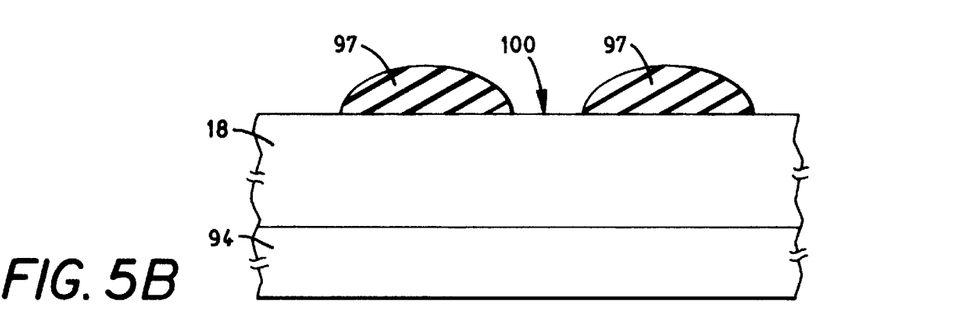
Figure 5C:
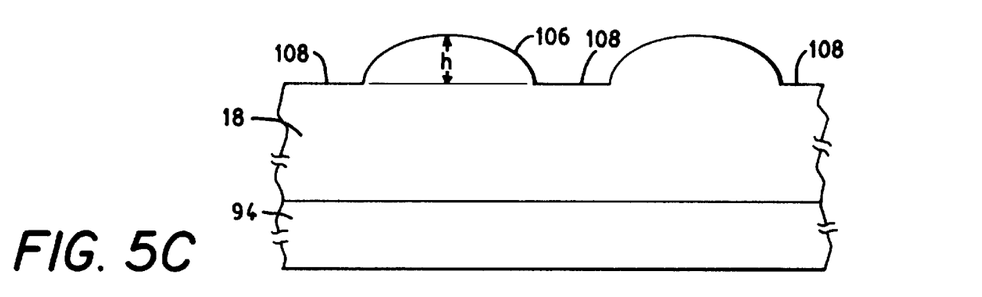
Figure 5D:
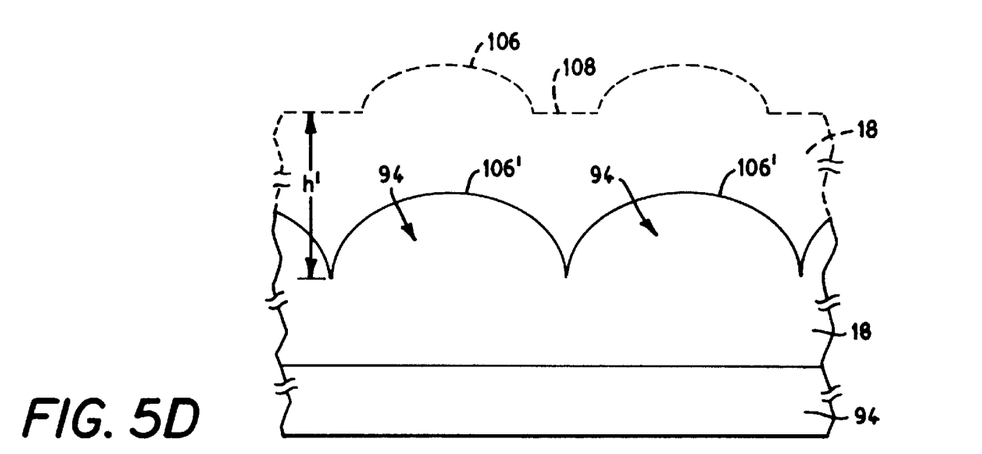
Figure 5E:
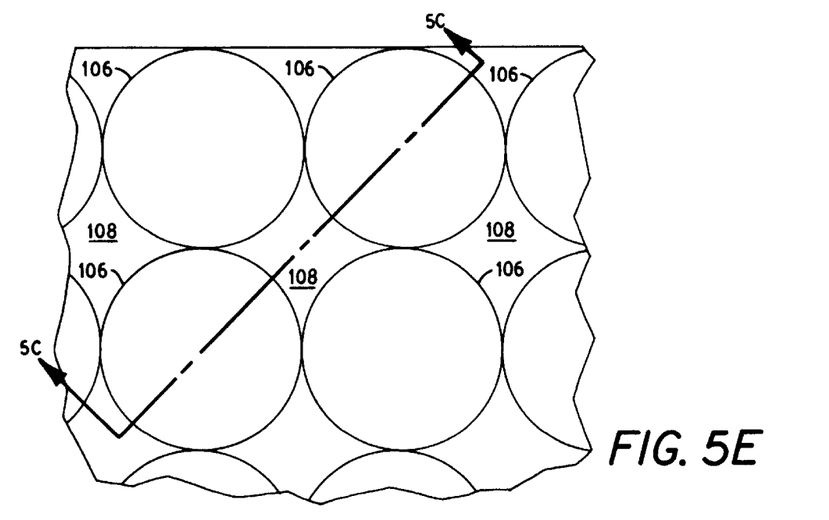
FIGS. 5E and 5F being plan views of such body, the schematic cross section elevation views of FIGS. 5C and 5D being taken along lines 5C–5C and 5D–5D, in FIGS. 5E and 5F, respectively.
Figure 5F:
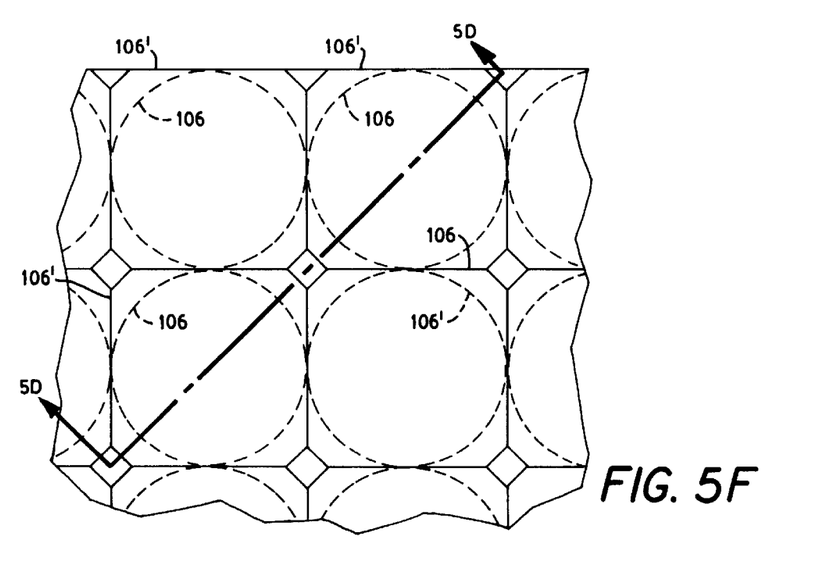
Figure 5G:
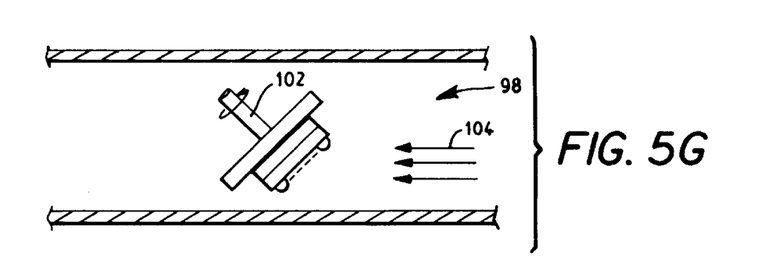
FIG. 5G being a schematic diagram of apparatus used in the several steps of the manufacture of such body.

Referring now to FIG. 5A–5G, the method used to form the lenses 26 will now be described. After forming the aluminum electrical contacts 90 (FIG. 1), the apertures 86, 88, the deposited ZnS and $Y_2O_3$ anti-reflection coating, and after thinning and polishing the underlying surface, but before forming the indium bumps 92 on the electrical contacts 90, the first semiconductor body 18 is then mounted with the apertured surface "face down", and affixed to a sapphire support 94 with an acetone removable adhesive, such as "Krazy Glue" brand adhesive or any cyanoacrylate adhesive. A layer of photoresist is deposited over the thinned and polished surface and is patterned into an array of rows and columns of circular disk shaped masking regions 96 using conventional photolithographic processing. as shown in FIG. 5A. The masked and sapphire mounted structure 94 is placed in a heater, not shown, to melt the photoresist and convert the disks shaped masking regions 96 into generally spherical shaped masked regions 97, as shown in FIG. 5B. The structure is next mounted to a rotatable, supporting shaft 102 of a conventional ion milling apparatus 99, as shown in FIGS. 5G. It is noted that the thinned, polished and masked surface 100 is disposed at an acute angle, here 60 degrees, with respect to the path 104 of the incoming milling ions, as shown. (Processes for forming lenses are described in: "Application of Microlenses to Infrared Detector Arrays" by Gorden et al, Infrared Physics, Vol. 31, No. 6, pp. 599–604, 1991; "Microlens Array" by Hutley et al, Physics World, July 1991, pp. 27–32; and, "A New Production Technique: Ion Milling" by Bollinger et al, Solid State Technology, November 1980, pp. 79–84). The energy of the incoming ions is relatively low so as not to damage the photoresist; here about 5 microns of silicon are removed in about 7.5 hours. The melted photoresist forming the masked regions 97 is etched away approximately at the same rate as the silicon semiconductor body 18. Thus, as the shaft 102 rotates, the generally spherical shaped masked regions 97 become replicated in the surface of the semiconductor body 18, and an array of rows and columns of laterally displaced, truncated generally spherical, silicon, dome shaped regions 106 is etched into the polished surface of the first semiconductor body 18 to provide the structure shown in FIGS. 5C and 5D. Here, the height, h, of each dome shaped region 106 is in the order of 7 microns. The etched surface is again disposed at an acute angle with respect to the incoming ions (albeit the energy of the incoming ions is higher than in the first milling operation; here about 40 microns of silicon are removed in about 11.5 hours) and rotated by shaft 102 (FIG. 5G) to remove flat portions 108, (FIGS. 5C and 5E) of silicon between the dome shaped regions 106, shown dotted in FIGS. 5D and 5F; thus, the dome shaped regions 106' are now, because of shadowing provided by the domes 106 (FIG. 5C), substantially contiguous, as shown in FIGS. 5D and 5F. (More particularly, the material under the flat portions 108 are removed to a depth, h', here 25 microns). The structure is removed from the ion milling apparatus 99 and is coated with an anti-reflection coating, not shown, here a layer of Zns followed by a layer of $Y_2O_3$. The first semiconductor body 18 is then removed from the sapphire support 94 (FIG. 5G) by acetone. The body is then remounted to the sapphire support 94, now with the lenses 26 "face down" on the sapphire support 94, again using an acetone removable adhesive. The bumps 92 (FIG. 2), here 10 microns high, are formed by evaporation onto the 5 micron aperture 86 (FIG. 2) exposed aluminum electrical contacts 90 to the read out circuits 16 using conventional "lift-off" techniques. (As is known, sapphire supports are used because incandescent, white light can pass through the sapphire, silicon, and HgCdTe materials and hence such effect is useful for alignment purposes).

Next the first semiconductor body 18 is mounted and affixed to the second semiconductor body 22. The indium bumps 72a on body 18 are pressed onto the indium bumps 92 on body 22 at room temperature. The pressing together in effect welds the array of indium bumps 72a formed on body 18 to the array of indium bumps 92 formed on body 22 with additional support and structural integrity being provided by the removable adhesive for subsequent processing.

With the first and second semiconductor bodies 18, 22 bonded, as described, the second semiconductor body 22 is thinned by first mechanically milling the bottom of the substrate to a thickness of here 6 mils and then chemically etching the milled surface with a solution of $K_2CrO_7$:$HNO_3$:$H_2O$. The chemical etching process selectively removes CdTe and thus continues until the CdTe substrate 60a (FIG. 3) is removed exposing the surface of the 20 to 25 micron thick epitaxial HgCdTe base layer 62a. The exposed surface is coated with an anti-reflection coating, not shown, (here by evaporating a 8000 Angstrom thick layer of CdTe) to complete the first array of radiation detectors 12.

Next, in like manner, the third semiconductor body 34 is mounted and affixed to the fourth semiconductor body 42. The indium bumps 72b on body 34 are pressed onto the indium bumps 82 on body 42 at room temperature. The pressing together in effect welds the array of indium bumps 72a formed on body 34 to the array of indium bumps 82 formed on body 42 with additional support and structural integrity being provided by the removable adhesive for subsequent processing. With the third and fourth semiconductor bodies 34, 42 bonded, as described, the third semiconductor body 34 is thinned by first mechanically milling the bottom of the substrate to a thickness of here 6 mils and then chemically etching the milled surface with a solution of $K_2CrO_7:HNO_3:H_2O$. The chemical etching process selectively removes CdTe and thus continues until the CdTe substrate 60b (FIG. 4) is removed exposing the surface of the 20 to 25 micron thick epitaxial HgCdTe base layer 62b. The exposed surface is coated with an anti-reflection coating, not shown, (here by evaporating a 8000 Angstrom thick layer of CdTe) to complete the second array of radiation detectors 24.

The first and second arrays of detectors 12, 24 are aligned as described in connection with FIGS. 1 and 2 and the anti-reflection coated, HgCdTe base layer 62a, 62b (FIGS. 3 and 4) surfaces bonded together with an infrared transparent epoxy, not shown, here Able stick 642 manufactured by Able bond. The epoxy here has a thickness of about 1 micron. Next the temporary acetone removable adhesive disposed between the indium bumps is removed from the first and second arrays of radiation detectors 12, 24 using acetone. The sapphire support, acetone adhesive mounted to the lenses 26 during the processing is removed with acetone. The first array of radiation detectors 12 are electrically connected to the sideboard 48, as shown in FIGS. 1 and 2 to complete the infrared apparatus 10.

Having described a preferred embodiment of the invention, it will now become readily apparent to one of skill in the art that other embodiments incorporating these concepts may be used. It is felt, therefore, that the invention should not be restricted to the disclosed embodiments, but rather should be limited only by the spirit and scope of the appended claims.

What is claimed is:

1. Radiation detection apparatus comprising:

a first array of radiation detectors comprising: a first array of detector devices adapted to detect a portion of radiation having a first wavelength impinging on the first array of detectors; and first electronic circuitry connected to the first array of detector devices for producing electrical signals representative of the detected portion of the radiation having the first wavelength, such first array of radiation detectors being adapted to pass therethrough a portion of the impinging radiation;

a second array of radiation detectors comprising: an second array of detector devices adapted to detect a portion of radiation having a second wavelength, passed through the first array of detectors, and impinging on the second array of detectors; and, second electronic circuitry connected to the second array of detector devices for producing electrical signals representative of the detected portion of the radiation having the second wavelength, wherein:

the first array of radiation detectors comprises: a first semiconductor body and wherein the electronic circuitry of the first array of detectors is formed in the first semiconductor body; and a second semiconductor body and wherein the first array of detector devices is formed in the second semiconductor;

the second array of radiation detectors comprises: a third semiconductor body and wherein the second array of detector devices is formed in the third semiconductor body; and a fourth semiconductor body and wherein the second electronic circuitry is formed in the fourth semiconductor body; and wherein the radiation impinging the first array of detector devices impinges upon a first surface of the second body to the first array of detector devices and the portion passing therethrough exits from the second body through a second surface thereof; and the second surface of the second body is attached to a first surface of the third body to the second array of detector devices.

2. The radiation detection apparatus recited in claim 1 wherein the radiation impinging the first array of radiation detectors passes from the first semiconductor body to the second semiconductor body for detection by the first array of detector devices, exits from the second semiconductor body and enters the third semiconductor body for detection by the second array of detector devices.

3. The radiation detection apparatus recited in claim 2 wherein the first semiconductor body has formed in a first surface thereof an array of lenses for directing the impinging radiation to the first array of detector devices formed in the second semiconductor body as such impinging radiation passes through such first semiconductor body.

4. An infrared energy detection apparatus comprising:

a first array of infrared detectors disposed on a first semiconductor body and adapted to detect infrared energy of a first wavelength and produce an electrical signal corresponding to such detected energy;

a second array of infrared detectors disposed on a second semiconductor body, each one of the second array of infrared detectors positioned to intercept infrared energy passing through a corresponding one of the first array of infrared detectors and adapted to detect energy in a second wavelength of the intercepted energy and produce an electrical signal corresponding to such detected energy;

a third semiconductor body comprising electronic circuitry to pass the electrical signal corresponding to such detected energy from the first array of infrared detectors; and a fourth semiconductor body comprising electronic circuitry to pass the electrical signal corresponding to such detected energy from the second array of infrared detectors.

5. The infrared energy detection apparatus recited in claim 4 wherein the second array of infrared detectors includes:

an array of detector devices adapted to detect a portion of radiation passed through the first array of detectors and impinging on the second array and having the second wavelength; and electronic circuitry for producing electrical signals representative of the detected energy having the second wavelength.

6. An infrared energy detection apparatus comprising:

a first array of infrared detectors disposed on a first semiconductor body, each one of the first array of infrared detectors adapted to detect infrared energy of a first wavelength and pass through infrared energy of a second wavelength, each one of the infrared detectors in the array being adapted to produce an electrical signal corresponding to such detected energy in a corresponding one of an array of pixels; a second array of infrared detectors disposed on a second semiconductor body, each one of the second array of infrared detectors adapted to detect infrared energy of the second wavelength, each one of the infrared detectors in the second array being positioned behind a corresponding one of the detectors in the first array and adapted to produce an electrical signal corresponding to such detected energy in a corresponding one of the array of pixels, the electrical signal produced by each one of the detectors in the first array of detectors being produced simultaneously with the electrical signal produced by the corresponding one of the detectors in the second array of detectors;

a third semiconductor body comprising electronic circuitry to pass the electrical signal from the first array of infrared detectors; and a fourth semiconductor body comprising electronic circuitry to pass the electrical signal corresponding to such detected energy from the second array of infrared detectors.

7. The infrared energy detection apparatus recited in claim 6 wherein the second array of infrared detectors includes:

an array of detector devices adapted to detect a portion of radiation passed through the first array of detectors and impinging on the second array and having the second wavelength; and electronic circuitry for producing electrical signals representative of the detected energy having the second wavelength.

* * * * *